(12) United States Patent
Dedieu et al.

(10) Patent No.: US 7,408,422 B2
(45) Date of Patent: Aug. 5, 2008

(54) VARIABLE-CAPACITANCE CIRCUIT ELEMENT

(75) Inventors: Sebastien Dedieu, Crolles (FR); Jean-Francois Larchanche, Saint Pierre de Chartreuse (FR); Frederic Paillardet, Aix les Bains (FR)

(73) Assignee: STMicroelectronics S.A., Montrouge (FR)

( * ) Notice: Subject to any disclaimer, the term of this patent is extended or adjusted under 35 U.S.C. 154(b) by 22 days.

(21) Appl. No.: 11/464,946

(22) Filed: Aug. 16, 2006

(65) Prior Publication Data

US 2007/0075791 A1 Apr. 5, 2007

(30) Foreign Application Priority Data

Aug. 23, 2005 (FR) .................................. 05 08684

(51) Int. Cl.
*H03B 5/18* (2006.01)
(52) U.S. Cl. ............. 331/177 V; 331/36 C; 331/117 R; 331/167
(58) Field of Classification Search ............... 331/36 C, 331/117 R, 177 FE, 108 A, 108 C, 167, 177 R, 331/177 V; 334/14, 15, 78
See application file for complete search history.

(56) References Cited

U.S. PATENT DOCUMENTS

| 6,657,509 | B1 | 12/2003 | Ohannes ................. 331/177 V |
| 6,753,738 | B1* | 6/2004 | Baird ........................... 331/25 |
| 2002/0171499 | A1* | 11/2002 | Momtaz et al. ......... 331/117 FE |
| 2005/0090218 | A1 | 4/2005 | Ishida et al. ................. 455/255 |
| 2005/0184812 | A1* | 8/2005 | Cho ........................... 331/36 C |
| 2006/0255865 | A1* | 11/2006 | Li ............................. 331/36 C |

\* cited by examiner

*Primary Examiner*—Robert J. Pascal
*Assistant Examiner*—Ryan J Johnson
(74) *Attorney, Agent, or Firm*—Lisa K. Jorgenson; Robert Iannucci; Seed IP Law Group PLLC

(57) ABSTRACT

An electronic circuit element has two capacitance values selected by means of a main control signal. The electronic circuit element comprises two variable-capacitance electronic components connected in parallel and each receiving opposite intermediate control signals, derived from the main control signal. The two variable-capacitance components are differentiated by a configuration parameter. The electronic circuit element exhibits a variation in capacitance corresponding to a difference between respective variations in capacitance of the two variable-capacitance electronic components during an inversion of the main control signal. The variation in capacitance of the electronic circuit element may be less than 5 attoFarads.

31 Claims, 6 Drawing Sheets

VARIABLE-CAPACITANCE CIRCUIT ELEMENT

BACKGROUND OF THE INVENTION

1. Field of the Invention

The present invention relates to a variable-capacitance circuit element and device, which may be used in particular in an oscillator with frequency controlled by a voltage.

2. Description of the Related Art

Certain applications of electronic circuits require a variable-capacitance capacitor. It is known to produce such a capacitor in the form of a circuit element consisting of two varactors connected in series. FIGS. 1a and 1b represent the production of such a variable-capacitance circuit element. The two varactors are produced in MOS technology (standing for "Metal-Oxide-Semiconductor"). An $N^-$ doping well, referenced 202, is formed in a P type semiconductor substrate, referenced 200. The well 202 is surrounded by an electric insulation barrier 201, for example of the STI type (standing for "Shallow Trench Isolator"). A central zone 203 and two lateral zones 204a and 204b, situated in the well 202, have a strengthened doping of N type, denoted $N^+$. A first MOS gate, referenced 205a, is formed on the surface S of the substrate 200 between the zones 203 and 204a, and a second MOS gate, referenced 205b, is formed on the surface S between the zones 203 and 204b. The gates 205a and 205b are electrically insulated from the well 202 by insulating layers 206a and 206b, respectively. Each of the two varactors, referenced 10a and 10b, therefore corresponds to a modified structure of MOS transistor, in which the channel zone on the one hand, and the source and drain zones on the other hand, have dopings of the same type but of different concentrations of doping species. The two varactors 10a and 10b are connected in series by the common zone 203. Preferably, they are identical. Together they constitute the variable-capacitance circuit element 1.

The zones 203, 204a and 204b are connected electrically by respective connections 13, 14a and 14b which are linked together. These connections form an intermediate link for arranging the varactors 10a and 10b in series (see FIG. 1b). The two gates 205a and 205b are connected electrically by respective connections 12a and 12b and form the two outputs of the circuit element 1.

A bias terminal 11 links moreover an additional $N^+$ doped zone, situated in the well 202. This terminal constitutes the input of the circuit element 1. The capacitance of the circuit element 1, measured between the outputs 12a and 12b, varies as a function of an electrical control voltage $C_1$ applied to the input 11.

Such a circuit element makes it possible to obtain minimal variations in capacitance which are of the order of 30 aF (aF standing for attoFarad, 1 aF=$10^{-18}$ F), for present-day MOS technologies. Now, these minimal variations are too big for certain applications. In particular, an oscillator with frequency controlled by a voltage, or VCO standing for "Voltage Controlled Oscillator", which is suitable for use with an inductance of 1 nH (nanoHenry) approximately in a radio transmitter, requires a frequency spacing of the order of 100 Hz (hertz) to 1 kHz (kilohertz). Such a frequency spacing corresponds roughly to a capacitance spacing of the order of 1 to 10 aF.

BRIEF SUMMARY OF THE INVENTION

An embodiment provides a variable-capacitance circuit element whose variation in capacitance may be less than 5 aF.

The embodiment provides an electronic circuit element suitable for having two capacitance values selected by means of a control signal, the said element comprising:

a noninverting transmission link and an inverter each receiving as input the control signal, and transmitting as output two respective intermediate signals, these intermediate signals having values associated with two distinct control states; and two electronic components connected at input to the output of the transmission link and to the output of the inverter, respectively, each component being suitable for possessing a variable capacitance between two outputs of this component, the capacitance varying as a function of the intermediate signal transmitted to this same component.

Furthermore, the outputs of the two variable-capacitance components are connected in parallel, and the two variable-capacitance components are differentiated by a configuration parameter so that, for at least one of the two control states, the capacitance of one of the two components is different from the capacitance of the other component for the other control state.

The outputs of the two variable-capacitance components which are connected in parallel constitute two outputs of the circuit element. Between them they exhibit a capacitance equal to the sum of the respective capacitances of each of the two components. This capacitance of the circuit element is equal to $\Gamma_1(C_1)+\Gamma_2(C_2)$, where $\Gamma_1$ and $\Gamma_2$ designate the respective capacitances of the two components for the values $C_1$ and $C_2$ of the intermediate signals applied at the input of each of them.

By virtue of the use of the noninverting transmission link and of the inverter at the input of each variable-capacitance component, the variation $\Delta\Gamma$ of the capacitance $\Gamma$ of the circuit element is:

$$\Delta\Gamma=[\Gamma_1(C_1)+\Gamma_2(C_2)]-[\Gamma_1(C_2)+\Gamma_2(C_1)]=\Delta\Gamma_1-\Delta\Gamma_2$$

where $\Delta\Gamma_i$ (i=1, 2) represents the variation in capacitance of each component between the two values of intermediate signal $C_1$ and $C_2$. Thus, the variation in capacitance of the circuit element is equal to the difference between the respective variations in capacitance of the two components. Stated otherwise, a circuit element according to the embodiment has a differential architecture, which associates two distinct components with variable capacitances. These components are differentiated by a configuration parameter, so that the variation $\Delta\Gamma_1$ is different from the variation $\Delta\Gamma_2$, but may be very close to the latter. Thus, if each of the variations $\Delta\Gamma_i$ is of the order of 30 aF, as is currently achievable with MOS varactors, the variation in capacitance $\Delta\Gamma$ of the circuit element may be much less than 30 aF. Preferably, the variation in capacitance of the circuit element is less than 5 aF, or even less than 2 aF. In a general manner, the variation in capacitance $\Delta\Gamma$ of the circuit element according to the embodiment may be at least three times less than the variation in capacitance $\Delta\Gamma_i$ of each component.

In a general manner, a benefit of the embodiment is to reduce the sensitivity of the variable capacitance with respect to any fluctuations of the control signal.

According to a preferred embodiment, each electronic component comprises a pair of varactors connected in series. The varactors of one and the same component have respective inputs linked together and form the input of this component for the corresponding intermediate signal. First respective outputs of the two varactors are linked together to form the series connection and second respective outputs of the two varactors form the outputs of this component. The embodiment of the circuit element may then exhibit a high level of integration. Furthermore, the input of each component exhibits a capacitance with each of the outputs of this component which is a fraction of the capacitance present between the two outputs of the component. When the two varactors of one and the same component are identical, the capacitance between the input of the component and each of its outputs is equal to half the capacitance present between the two outputs of this component. Such a relationship is advantageous when the circuit element is used in a circuit which has a symmetric configuration. In particular, parasitic interactions between distinct parts of the circuit may thus be reduced or cancelled.

The embodiment also provides a variable-capacitance device comprising at least one first electronic circuit element as described above, and at least one second electronic circuit with variable capacitance, the first and second circuit elements being connected in parallel so that their respective capacitances add together. Such a device may have a variation in capacitance which is greater than that of the first circuit element alone, since it results from a combination between the respective variations in capacitance of the first and second circuit elements.

In particular, when the first and second circuit elements have separate respective inputs for receiving different control signals, the device exhibits three or four values of capacitance which result from all the possible combinations of the respective values of capacitance of the two circuit elements. If the respective variations in capacitance of the two circuit elements are different, the device can adopt four distinct values of capacitance, as a function of the control signals addressed to each circuit element.

The embodiment further provides an oscillator with frequency controlled by a voltage comprising an inductor having two terminals connected respectively to the outputs of an electronic circuit element, or of a variable-capacitance device as described above. Such an oscillator exhibits a frequency variation which may be very small. This variation may be less than 1 kHz (kilohertz), for example, or even less than 100 Hz. The oscillator is then especially suitable for making a GSM (Global System for Mobile Communication) transmitter, for example.

BRIEF DESCRIPTION OF THE SEVERAL VIEWS OF THE DRAWING(S)

Other features and advantages of the present embodiments will become apparent in the description hereinbelow of non-limiting exemplary embodiments, with reference to the appended drawings, in which:

FIG. 1b is an electrical diagram of the circuit element according to the prior art of the FIG. 1a;

FIG. 5b is a chart of variations in the capacitance and in the frequency of a VCO oscillator according to FIG. 5a.

DETAILED DESCRIPTION OF THE INVENTION

Figure 1A:
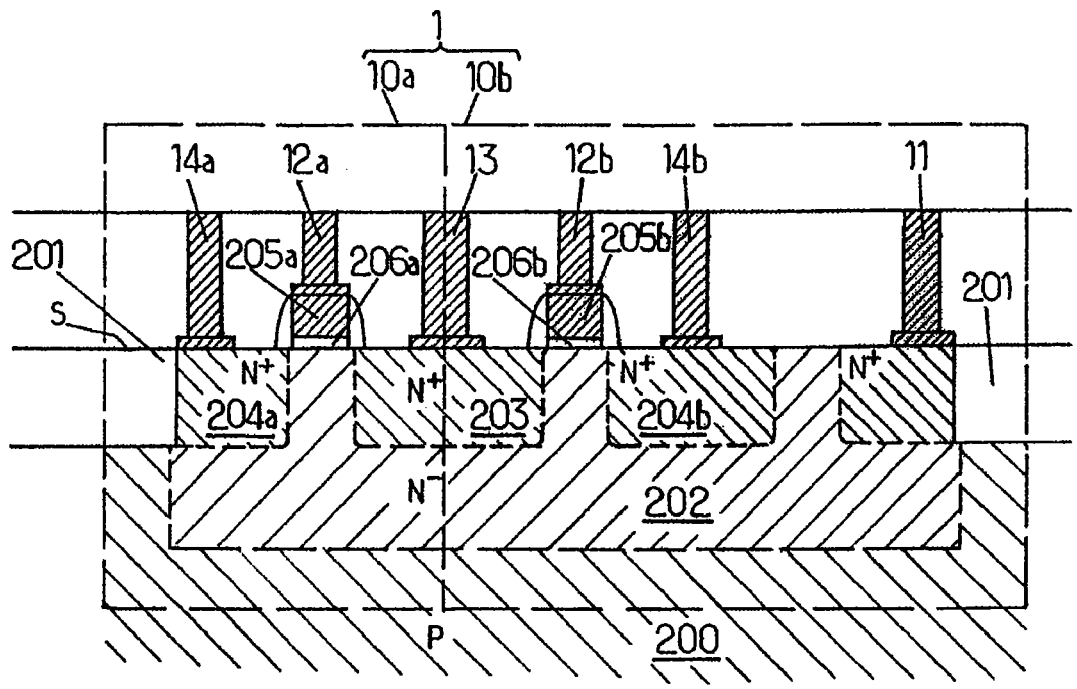
FIG. 1a illustrates an embodiment of a circuit element with variable capacitance according to the prior art.
Figure 1B:
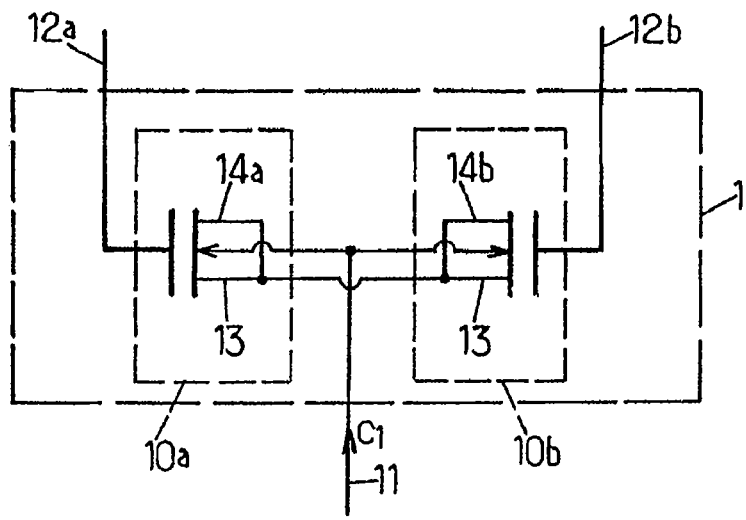

FIGS. 1a and 1b, which relate to a circuit element with variable capacitance according to the prior art, have already been described and are not dealt with again.

Figure 2A:
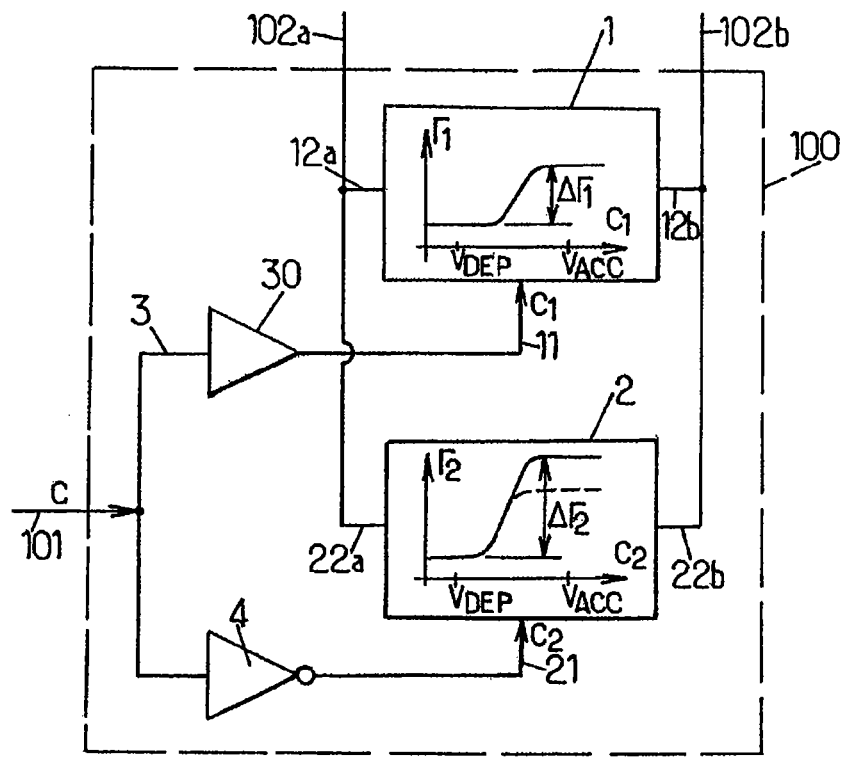
FIG. 2a is a schematic diagram of a circuit element with variable capacitance according to an embodiment.

In accordance with FIG. 2a, a circuit element according to an embodiment, referenced 100, comprises an input 101 intended to receive a control signal C. The control signal C is transmitted on the one hand to a transmission link 3, which is noninverting and may comprise an adapter 30, and on the other hand to an inverter 4. An output of the link 3 is connected to an input 11 of a variable-capacitance component, referenced 1, and an output of the inverter 4 is connected to an input 21 of a second variable-capacitance component, referenced 2. Two outputs 12a and 12b of the component 1 are respectively connected to two outputs 22a and 22b of the component 2. The outputs 12a and 22a, connected together, form a first output 102a of the element of the circuit 100. Likewise, the outputs 12b and 22b form a second output 102b of the circuit element 100. The variable capacitance of the circuit element 100 is present between the outputs 102a and 102b.

The input 11 of the component 1 receives an intermediate signal $C_1$ transmitted by the link 3. The component 1 exhibits a capacitance $\Gamma_1$ between its two outputs 12a and 12b, which is determined by the signal $C_1$. The latter adopts values which correspond to two distinct control states, of which just one is selected at each instant by the value of the signal C. Preferably, the characteristic of the component 1, which illustrates the variations in $\Gamma_1$ as a function of $C_1$, exhibits at minimum two intervals in which the capacitance $\Gamma_1$ hardly depends on the signal $C_1$, or is independent of this signal. In particular, it may exhibit two distinct plateaux substantially parallel to the abscissa axis $C_1$. The values of the signal $C_1$ for the two control states are situated respectively in the two plateaux, so that the value of $C_1$ may possibly fluctuate without these fluctuations affecting the value of $\Gamma_1$.

In the same way, the input 21 of the component 2 receives an intermediate signal $C_2$ produced by the inverter 4. The component 2 operates in a similar manner to the component 1: the capacitance $\Gamma_2$ present between the outputs 22a and 22b takes two values which correspond to the signal $C_2$ respectively for each of the two control states. At least one of these values of $\Gamma_2$ is different from the values of $\Gamma_1$ for the two control states, owing to a configuration parameter which differs between the components 1 and 2. For example, the value of $\Gamma_2$ which corresponds to the highest value of intermediate signal is larger than the value of $\Gamma_1$ for the same value of intermediate signal. In FIG. 2a, the broken line represented on the characteristic of the component 2 reproduces the characteristic of the component 1, for comparison.

Given that the intermediate signals $C_1$ and $C_2$ are produced respectively by the noninverting transmission link 3 and by the inverter 4, they are complementary in binary logic. Thus, at each instant, the signals $C_1$ and $C_2$ select respective operating points of the components 1 and 2 which do not belong to one and the same plateau of the characteristics $\Gamma_1(C_1)$ and $\Gamma_2(C_2)$. A suitable variation in the control signal C brings about an exchange between these two operating points.

Figure 2B:
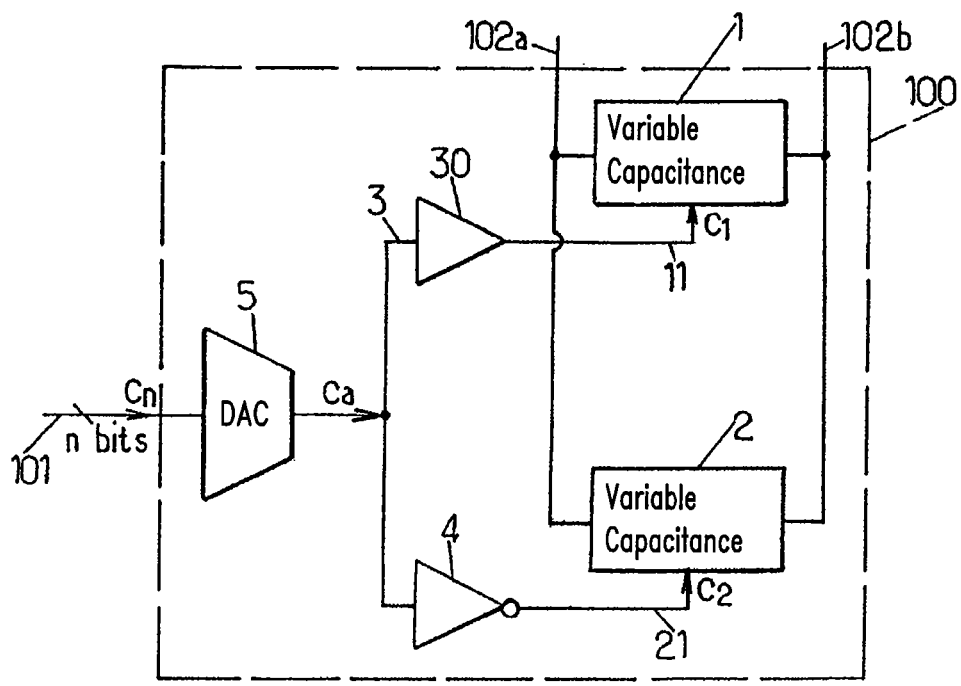
FIGS. 2b and 2c are schematic diagrams of two variant embodiments of the invention.

According to a first variant embodiment illustrated by FIG. 2b, the control signal C applied to the input 101 of the circuit element 100 is a digital signal. It is denoted Cn and may be coded on n bits, n being an integer greater than unity. The circuit element 100 then furthermore comprises a digital-analog converter, denoted DAC and referenced 5, which converts the signal Cn into an analog control signal Ca. The output of the converter 5 is linked to the respective inputs of the link 3 and of the inverter 4. The adapter 30 included in the link 3 may be an amplifier with positive gain, and the inverter 4 may be an amplifier with negative gain.

Figure 2C:
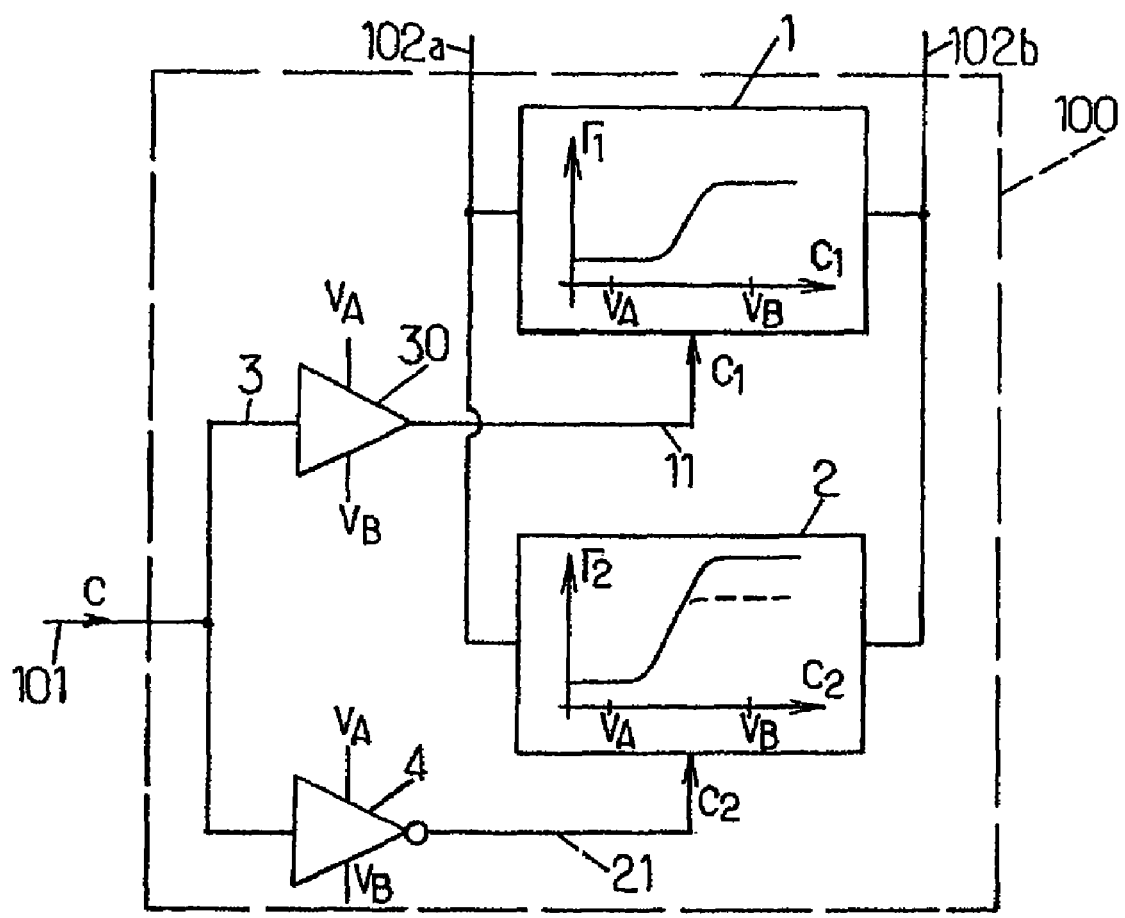

According to a second variant illustrated by FIG. 2c, the control signal C is an analog signal. The adapter 30 included in the link 3 may then be a threshold adapter. The adapter 30 and the inverter 4 are each connected for power supply to two terminals having respective electric potentials $V_A$ and $V_B$. The intermediate signals $C_1$ and $C_2$ are electrical voltages, and the potentials $V_A$ and $V_B$ are determined so that the values of the signals $C_1$ and $C_2$ for each control state correspond to the plateaux of the respective characteristics of the components 1 and 2. Preferably, the signal C exhibits variations between the two control states such that the adapter 30 and the inverter 4 operate at saturation. In this case, the intermediate signals $C_1$ and $C_2$ are respectively almost equal to $V_A$ and $V_B$, or vice versa, depending on the control state of the circuit element 100.

According to the preferred embodiment, the variable-capacitance electronic components 1 and 2 are each of the type illustrated by FIGS. 1a and 1b. Each of the components 1, 2 is therefore composed of two varactors 10a, 10b connected in series, whose respective inputs receive the intermediate signal $C_1$ or $C_2$ transmitted to this component. The outputs of the varactors of the component 1 as well as the component 2) which are opposite to the series connection internal to this component constitute the two outputs 12a and 12b (while 22a and 22b constitute outputs of component 2).

Each varactor is made in MOS technology. It is made in a doping well 202 of a determined type and formed in a semiconductor substrate 200. The substrate 200 is for example monocrystalline silicon of P type, and the well 202 is of N⁻ type. Advantageously, the two varactors of one and the same component 1 or 2 are made in the same well. In this case, the inputs of the two varactors of one and the same component are merged into a single input 11 of intermediate signal $C_1$ or $C_2$ which is shared between the two varactors of this component. This intermediate signal biases the well 202 with respect to the gates 12a and 12b. Each varactor's first output, constituted for example by the connections 13 and 14a, is linked to two zones of increased doping of the same type as that of the well, respectively 203 and 204a, which are formed in the well 202. In the exemplary embodiment described here, the zones of increased doping are of the N⁺ type. The second output of each varactor is constituted by the connection which links the MOS gate formed above the doping well, between the zones of increased doping.

A varactor made in MOS technology, such as the varactor 10a of FIG. 1a, in which the zones of strengthened doping 203 and 204a have the same type of doping as the well 202, has two distinct ways of operating, namely operating by depletion and by accumulation. One of these two ways of operating is selected by the electric potential corresponding to the intermediate signal $C_1$ or $C_2$ which is applied to the input of the varactor. This potential is also called the intermediate potential. Operation by depletion is obtained when the intermediate potential $C_1$ is less than a first threshold value, denoted $V_{DEP}$, and operation by accumulation is obtained when the intermediate potential $C_1$ is greater than a second threshold value, denoted $V_{ACC}$, greater than $V_{DEP}$. For accumulation operation, that is to say for $C_1 > V_{ACC}$, the capacitance of the varactor between, on the one hand, the interlinked connections 13 and 14a and, on the other hand, the gate connection 12a, is equal to $\lceil_{ACC}$. For depletion operation, that is to say for $C_1 < V_{DEP}$, the varactor capacitance measured in the same manner is equal to $(\lceil_{ACC}^{-1} + \lceil_{DEP}^{-1})^{-1}$. $\lceil_{DEP}$ is a positive contribution to the capacitance of the varactor, which corresponds to a voiding of the electric carriers from a well 202 zone situated under the gate 205a, called the depletion zone. The variation in capacitance of the varactor 10a is therefore equal to the difference between $\lceil_{ACC}$ and $(\lceil_{ACC}^{-1} + \lceil_{DEP}^{-1})^{-1}$: $\lceil_{ACC} - (\lceil_{ACC}^{-1} + \lceil_{DEP}^{-1})^{-1}$. This variation is positive.

The two varactors 10a and 10b are designed to operate simultaneously in depletion or in accumulation mode, when they receive the same intermediate potential $C_1$ as input. In particular, the varactors 10a and 10b may be identical. The variation $\Delta\lceil_1$ in capacitance of the component 1 results from a combination of the variations in capacitance of the two varactors 10a and 10b, between their accumulation operation and depletion operation. The two plateaux of the characteristic $\lceil_1(C_1)$, respectively for $C_1 < V_{DEP}$ and for $C_1 > V_{ACC}$, correspond to these two ways of operating. $\Delta\lceil_1$ depends in particular on the areas of the gates 205a and 205b, measured parallel to the surface S of the substrate 200.

In the embodiment described here, the component 2 possesses an identical structure to that of the component 1. The components 1 and 2 therefore exhibit operating thresholds in depletion and accumulation mode which are substantially equal.

Moreover, the components 1 and 2 are differentiated by a configuration parameter which determines the values of $\lceil_1$ and $\lceil_2$ for each plateau of their characteristics. The respective variations in capacitance of the components 1 and 2 are then different: $\Delta\lceil_1 \# \Delta\lceil_2$. The configuration parameter may be, in particular, the gate area of one at least of the varactors of each component 1, 2. For example, the areas of the gates of the two varactors of the component 1 may be 65 nm×410 nm, and those of the two varactors of the component 2 may be 65 nm×475 nm. When the gate area is chosen as configuration parameter to differentiate the components 1 and 2, the minimal variation in capacitance of the circuit element 100 which is achievable depends on the MOS technology used. In a known manner, this technology is characterized by the dimension of the spacing of the gate mask pattern.

Figure 3:
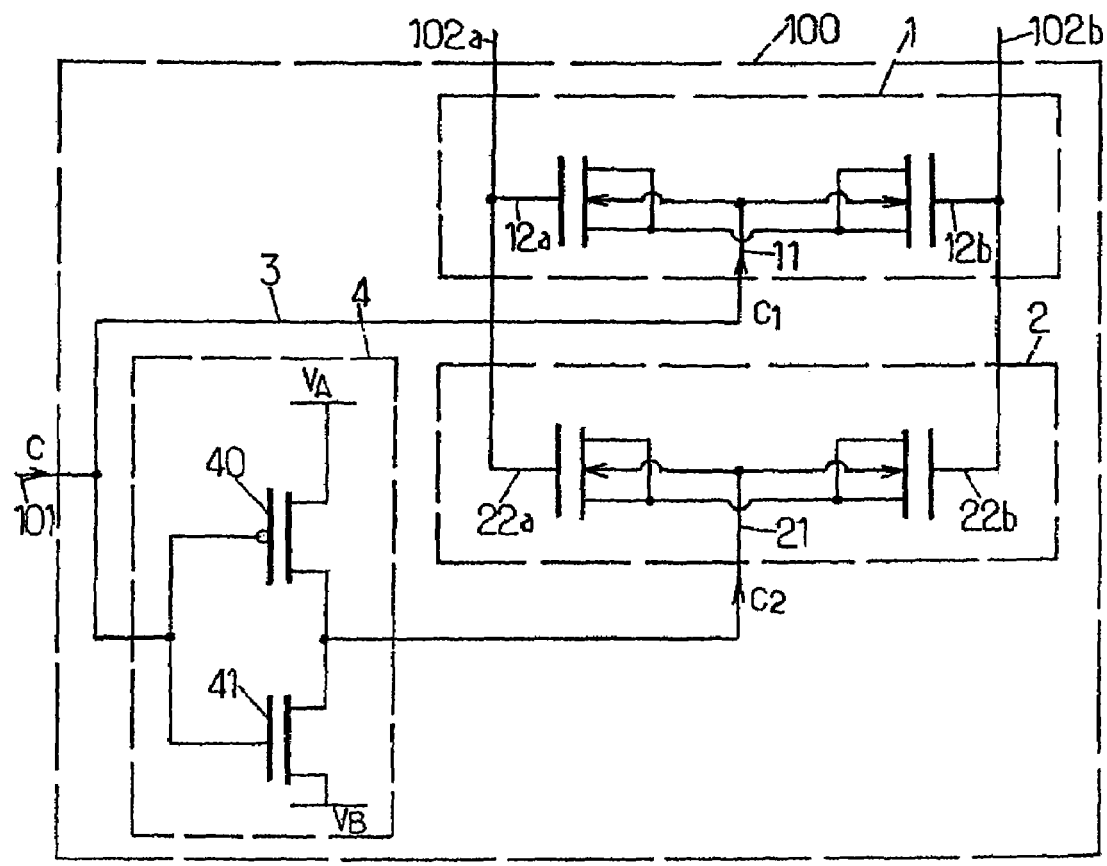
FIG. 3 is an electrical diagram of a circuit element with variable capacitance according to an embodiment.

FIG. 3 is an electrical diagram of the circuit element 100 thus embodied. According to this diagram, the transmission link 3 is a simple electrical connection. The intermediate potential $C_1$ is then identical to the control signal C, which varies between two values respectively less than $V_{DEP}$ and greater than $V_{ACC}$.

The inverter 4 consists of two transistors 40 and 41, respectively of P-MOS and N-MOS type. The drains of the transistors 40 and 41 are connected together and constitute the output of the inverter 4. The gates of the transistors 40 and 41 are connected together and constitute the input of the inverter 4. The sources of the two transistors are connected respectively to two power supplies having electrical potentials respectively equal to $V_A$ and $V_B$. The values of $V_A$ and $V_B$ are chosen so that the electrical potential produced by the inverter 4 on the basis of the control signal C, and which corresponds to the intermediate potential $C_2$, varies between two values situated in the plateaux of the characteristic $\lceil_2(C_2)$ of the component 2.

Figure 4:
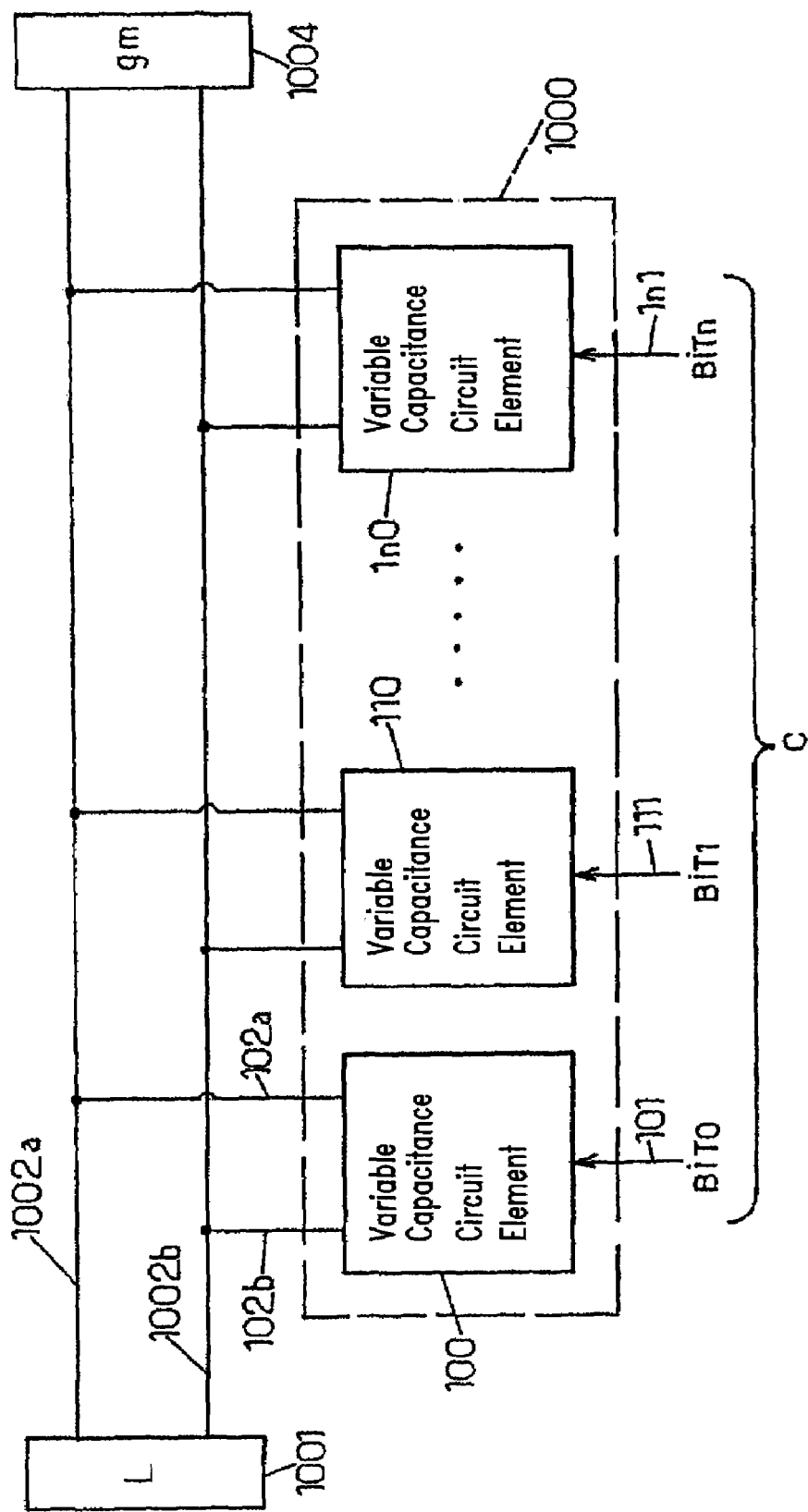
FIG. 4 is an electrical diagram of a device with variable capacitance according to an embodiment.
Figure 5A:
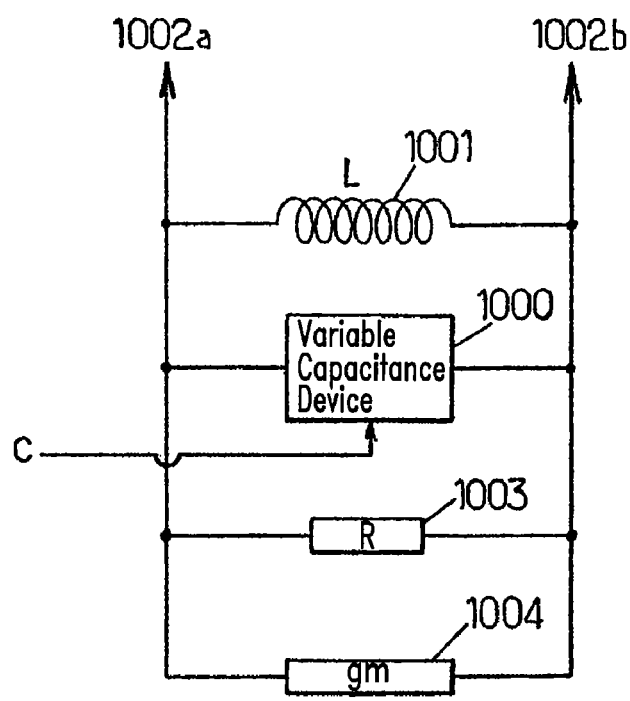
FIG. 5a is an electrical diagram of a VCO oscillator which incorporates a variable-capacitance device according to an embodiment.

FIGS. 4 and 5a illustrate a use of the variable-capacitance circuit element 100 described previously, within a VCO oscillator. In a known manner, a VCO oscillator can comprise an inductor L, referenced 1001, a capacitive device, referenced 1000, and a negative-resistance component, denoted gm and referenced 1004. These components are each connected between two conducting lines 1002a and 1002b. The negative resistance gm compensates for oscillator energy dissipation, symbolized by a resistor R referenced 1003 in FIG. 5a.

The device 1000 comprises several variable-capacitance elements connected in parallel between the lines 1002a and 1002b. One of these elements is the element 100, whose outputs 102a and 102b are connected respectively to the lines 1002a and 1002b. On account of the behavior of the inductor 1001 in the steady state, for each variable-capacitance component 1, 2 of the element 100, the input 11 and the connections 13, 14a and 14b are all at one and the same value of DC electrical potential, fixed by the corresponding control signal, C1 or C2.

The other variable-capacitance elements of the device 1000 are referenced 110, ..., 1n0. Possibly, all the elements 100, 110, ..., 1n0 may be of the type corresponding to the invention. Alternatively, one of these elements may be of some other type such as, for example, a parallel association of several capacitors, each capacitor being activated or deactivated by means of a switch disposed for this purpose. The variable-capacitance circuit elements which constitute the device 1000 may each be controlled by a control bit, denoted bit0 for element 100, bit1 for element 110, etc, and bitn for the last element 1n0.

According to a first mode of control, the bits bit0, bit1, ..., bitn are independent and the elements 100, 110, ..., 1n0 have identical variations in capacitance. Preferably, all the elements 100, 110, ..., 1n0 are identical. The bits bit0, bit1, ..., bitn then have one and the same weight in regard to the control of the device 1000. Such a mode of control is said to be unitary. It makes it possible to obtain improved reproducibility of the total capacitance of the device 1000 as measured between the lines 1002a and 1002b.

According to a second mode of control, the bits bit0, bit1, ..., bitn constitute a digital value, denoted C, for control of the variable-capacitance device 1000. Thus, the input 101 of the element 100 receives the value of the lowest-order bit, bit0, the input 111 of the element 110 receives the value of the second-order bit bit1, etc, and the input 1nH of the element 1n0 receives the value of the highest-order bit, bitn. In this case, the variation in capacitance of the circuit element which corresponds to a given bit is advantageously equal to twice the variation in capacitance of the circuit element which corresponds to the bit of immediately lower order. Thus, the variation in capacitance in the circuit element 110 is advantageously equal to twice that of the circuit element 100. The value of the inductor L is fixed and may be 1nH for example. The frequency f of the oscillator is then directly fixed numerically by the control value C, according to the formula:

$$f = \frac{1}{2\pi\sqrt{L\Gamma(C)}}$$

Figure 5B:
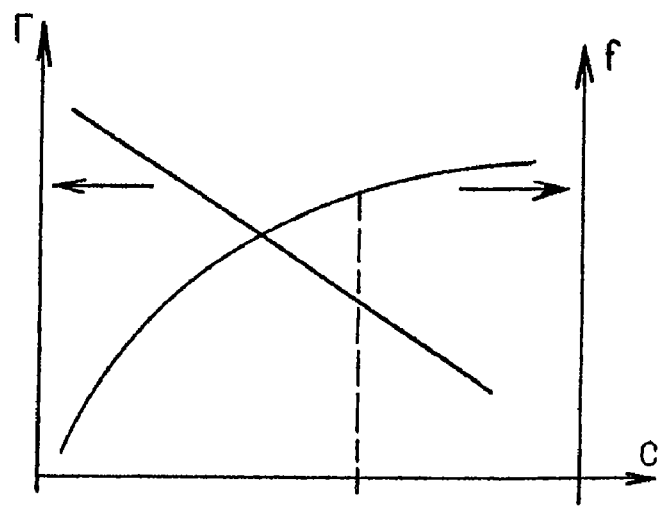

FIG. 5b illustrates the variations in the capacitance Γ of the device 1000 and in the frequency f of the oscillator which are thus obtained, as a function of the control value C.

In this use of the circuit element 100 according to the invention, the values of the intermediate potentials $C_1$ and $C_2$, for each control state fixed by the first bit of the word C (bit0), are advantageously far removed from the threshold values $V_{DEP}$ and $V_{ACC}$. In this case, the variations in the voltage between the lines 1002a and 1002b, corresponding to the output signal of the oscillator, do not cause secondary variations in the capacitance $\Gamma_1$ of the circuit element 100, for each value of bit0. The frequency f of the oscillator is then defined accurately for each control value C.

It is understood that modifications of the inventive embodiment which has been described in detail hereinabove may be introduced while retaining some at least of the advantages cited. In particular, the following modifications which are easily achievable may be cited:

the substrate 200 may be of N type, the zone 202 of the varactors may be $P^-$ doped and the zones 203, 204a and 204b may be $P^+$ doped;

the components 1 and 2 may be embodied with more advanced MOS technologies than 65 nm technology;

the components 1 and 2 may possess a makeup other than that of two varactors connected in series. In particular, they may be constituted by any MOS element which exhibits a capacitance varying monotonically as a function of a control signal; and the input 11 may be merged with the connection 13, and possibly also with the connections 14a and 14b. A single connection is then disposed in the gap situated between the gates 12a and 12b, in contact with the doped zone 203. Symmetric variable-capacitance components 1 and 2 are thus made, and the circuit element 100 resulting therefrom exhibits its truly differential operation.

The invention claimed is:

1. An electronic circuit element suitable for having two capacitance values selected by a control signal, the electronic circuit element comprising:

a non-inverting transmission link having an input that receives the control signal;

an inverter having an input that receives the control signal, wherein the non-inverting transmission link and the inverter transmit first and second intermediate signals, respectively, the intermediate signals having values associated with distinct first and second control states;

a first electronic component having an input electrically coupled to the non-inverting transmission link to receive the first intermediate signal, the first electronic component having a first variable capacitance between two outputs of the first electronic component, the first variable capacitance varying as a function of the first intermediate signal, the first variable capacitance having a first non-zero capacitance value in response to the first control state of the first intermediate signal and having a second non-zero capacitance value in response to the second control state of the first intermediate signal;

a second electronic component having an input electrically coupled to a transmission link to receive the second intermediate signal produced by the inverter, the second electronic component having a second variable capacitance between two outputs of the second electronic component, the second variable capacitance varying as a function of the second intermediate signal, the second variable capacitance having a first non-zero capacitance value in response to the first control state of the second intermediate signal and having a second non-zero capacitance value in response to the second control state of the second intermediate signal, wherein the first and second variable capacitances are connected in parallel; and outputs coupled to exhibit an output capacitance substantially equivalent to a sum of the first non-zero capacitance values of the first and second variable capacitances during the first control state, the output capacitance being substantially equivalent to a sum of the second non-zero capacitance values of the first and second variable capacitances during the second control state, the first and second variable capacitances being differentiated by a configuration parameter so that the first non-zero capacitance value of the first electronic component is different from the second non-zero capacitance value of the second electronic component.

2. The electronic circuit element according to claim 1, in which a variation in capacitance of the electronic circuit element is at least three times less than a variation in capacitance of each of the first and second electronic components.

3. The electronic circuit element according to claim 1, in which the first electronic component comprises a first pair of varactors connected in series, the first pair of varactors are of one and the same electronic component having respective inputs linked together and forming the input of the first electronic component for receiving the first intermediate signal, first respective outputs of the first pair of varactors are linked together to form the series connection and second respective outputs of the first pair of varactors from the respective outputs of the first electronic component.

4. The electronic circuit element according to claim 3, in which the first pair of varactors is made in a doping well of a determined type formed in a semiconductor substrate, and in which, for the first pair of varactors, the input is disposed so as to bias the doping well with respect to the substrate, the first respective outputs are linked to two zones of increased doping of a determined type which are formed in the well, and the second respective outputs are linked to a MOS gate formed above the well between the two zones of increased doping.

5. The electronic circuit element according to claim 3 wherein the second electronic component further comprises a second pair of varactors connected in series, the second pair of varactors are of one and the same electronic component having respective inputs linked together and forming the input of the second electronic component for receiving the second intermediate signal, first respective outputs of the second pair of varactors are linked together to form the series connection and second respective outputs of the second pair of varactors form the respective outputs of the second electronic component.

6. The electronic circuit element according to claim 5, in which the first and second pairs of varactors of one and the same electronic component are made in one and the same well associated with the electronic component, the respective inputs of the first and second pairs of varactors being merged.

7. The electronic circuit element according to claim 5, in which the configuration parameter differentiating the first and second variable capacitances between the respective outputs of the first and second electronic components comprises a gate area of at least one of the first and second pairs of varactors of the first and second electronic components, respectively.

8. The electronic circuit element according to claim 1, in which a variation in capacitance of the electronic circuit element is less than 5 attoFarads.

9. The electronic circuit element according to claim 8, in which the variation in capacitance of the electronic circuit element is less than 2 attoFarads.

10. The electronic circuit element according to claim 1, further comprises a digital/analog converter for converting a digital control signal into an analog control signal, an output of the digital/analog converter being linked to the respective inputs of the transmission link and of the inverter.

11. The electronic circuit element according to claim 1, in which the transmission link comprises a threshold adapter, the threshold adapter and the inverter being each connected for power supply to two terminals having respective electric potentials determined so that the values of the first and second intermediate signals for the first and second control states correspond to plateaux of respective characteristics of the first and second electronic components.

12. A variable-capacitance device comprising:
a first electronic circuit element including:
a non-inverting transmission link having an input that receives the control signal;
an inverter having an input that receives the control signal, wherein the non-inverting transmission link and the inverter transmit first and second intermediate signals, respectively, the intermediate signals having values associated with distinct first and second control states;
a first electronic component having an input electrically coupled to the non-inverting transmission link to receive the first intermediate signal, the first electronic component having a first variable capacitance between two outputs of the first electronic component, the first variable capacitance varying as a function of the first intermediate signal, the first variable capacitance having a first non-zero capacitance value in response to the first control state of the first intermediate signal and having a second non-zero capacitance value in response to the second control state of the first intermediate signal;
a second electronic component having an input electrically coupled to transmission link to receive the second intermediate signal produced by the inverter, the second electronic component having a second variable capacitance between two outputs of the second electronic component, the second variable capacitance varying as a function of the second intermediate signal, the second variable capacitance having a first non-zero capacitance value in response to the first control state of the second intermediate signal and having a second non-zero capacitance value in response to the second control state of the second intermediate signal, wherein the first and second variable capacitances are connected in parallel;
outputs coupled to exhibit an output capacitance substantially equivalent to a sum of the first non-zero capacitance values of the first and second variable capacitances during the first control state, the output capacitance being substantially equivalent to a sum of the second non-zero capacitance values of the first and second variable capacitances during the second control state, the first and second variable capacitances being differentiated by a configuration parameter so that the first non-zero capacitance value of the first electronic component is different from the second non-zero capacitance value of the second electronic component; and
a second electronic circuit element with a third variable capacitance, the first and second electronic circuit elements being connected in parallel so that the respective variable capacitances of the first and second electronic circuit elements add together.

13. The variable-capacitance device according to claim 12, in which the first and the second electronic circuit elements have separate respective inputs for receiving different control signals.

14. The variable-capacitance device according to claim 12, in which the first and second electronic circuit elements have separate respective inputs for receiving independent control signals, and in which respective variations in the variable capacitances of the first and second electronic circuit elements are identical.

15. The variable-capacitance device according to claim 14, in which the first and second electronic circuit elements are identical.

16. The variable-capacitance device according to claim 12, in which respective variations in the variable capacitances of the first and second electronic circuit elements are different.

17. The variable-capacitance device according to claim 16, in which the variation in the third variable capacitance of the second circuit element is substantially equal to twice the variation in the first variable capacitance of the first circuit element.

18. An oscillator having a frequency controlled by a voltage comprising:
a non-inverting transmission link having an input that receives the control signal;
an inverter having an input that receives the control signal, wherein the non-inverting transmission link and the inverter transmit first and second intermediate signals, respectively, the intermediate signals having values associated with distinct first and second control states;
a first electronic component having an input electrically coupled to the non-inverting transmission link to receive the first intermediate signal, the first electronic component having a first variable capacitance between two outputs of the first electronic component, the first variable capacitance varying as a function of the first intermediate signal, the first variable capacitance having a first non-zero capacitance value in response to the first control state of the first intermediate signal and having a second non-zero capacitance value in response to the second control state of the first intermediate signal;
a second electronic component having an input electrically coupled to the transmission link to receive the second intermediate signal produced by the inverter, the second electronic component having a second variable capacitance between two outputs of the second electronic component, the second variable capacitance varying as a function of the second intermediate signal, the second variable capacitance having a first non-zero capacitance value in response to the first control state of the second intermediate signal and having a second non-zero capacitance value in response to the second control state of the second intermediate signal, wherein the first and second variable capacitances are connected in parallel;
outputs coupled to exhibit an output capacitance substantially equivalent to a sum of the first non-zero capacitance values of the first and second variable capacitances during the first control state, the output capacitance being substantially equivalent to a sum of the second non-zero capacitance values of the first and second variable capacitances during the second control state, the first and second variable capacitances being differentiated by a configuration parameter so that the first non-zero capacitance value of the first electronic component is different from the second non-zero capacitance value of the second electronic component; and
an inductor having two terminals connected respectively to the outputs of the first and second electronic components.

19. The oscillator according to claim 18, having a frequency variation of less than 1 kilohertz.

20. The oscillator according to claim 19, having a frequency variation of less than 100 hertz.

21. A method for providing minimal variations in an output capacitance of a circuit element, the method comprising:
receiving a control signal at an input of the circuit element, the control signal being used to select the output capacitance of the circuit element;
transmitting first and second intermediate signals to first and second electronic components, respectively, upon receiving the control signal, the first and second intermediate signals having values associated with first and second distinct control states;
providing a first variable capacitance between two outputs of the first electronic component with a first non-zero capacitance value in response to the first control state of the first intermediate signal and with a second non-zero capacitance value in response to the second control state of the first intermediate signal, the first variable capacitance being varied as a function of the first intermediate signal transmitted to the first electronic component;
providing a second variable capacitance between two outputs of the second electronic component with a first non-zero capacitance value in response to the first control state of the second intermediate signal and with a second non-zero capacitance value in response to the second control state of the second intermediate signal, the second variable capacitance being varied as a function of the second intermediate signal transmitted to the second electronic component;
providing the output capacitance of the circuit element with a variation in capacitance that is equal to the difference between respective variations in the first and second variable capacitances of the first and second electronic components;
providing the output capacitance of the circuit element with a capacitance substantially equivalent to a sum of the first non-zero capacitance values of the first and second variable capacitances during the first control state; and
providing the output capacitance of the circuit element with a capacitance substantially equivalent to a sum of the second non-zero capacitance values of the first and second variable capacitances during the second control state.

22. The method of claim 21 wherein transmitting the first and second intermediate signals to the first and second electronic components, respectively, includes transmitting each of the first and second intermediate signals to a pair of varactors that are electrically serially connected.

23. The method of claim 21 wherein providing the output capacitance of the circuit element with the variation in capacitance includes providing the output capacitance of the circuit element with the variation in capacitance that is at least three times less than the variations in the first and second variable capacitances of the first and second electronic components.

24. The method of claim 21 wherein providing the output capacitance of the circuit element with the variation in capacitance includes providing the output capacitance of the circuit element with the variation in capacitance that is less than 5 attoFarads.

25. The method of claim 21 wherein providing the output capacitance of the circuit element with the variation in capacitance includes providing the output capacitance of the circuit element with the variation in capacitance that is less than 2 attoFarads.

26. An electronic circuit element suitable for having two capacitance values selected by a control signal, the electronic circuit element comprising:
a non-inverting transmission link having an input that receives the control signal;
an inverter having an input that receives the control signal, wherein the non-inverting transmission link and the inverter transmit first and second intermediate signals, respectively, the intermediate signals having values associated with distinct first and second control states;
a first electronic component having an input electrically coupled to the non-inverting transmission link to receive the first intermediate signal, the first electronic component having a first variable capacitance between two outputs of the first electronic component, the first variable capacitance varying as a function of the first intermediate signal;

a second electronic component having an input electrically coupled to a transmission link to receive the second intermediate signal produced by the inverter, the second electronic component having a second variable capacitance between two outputs of the second electronic component, the second variable capacitance varying as a function of the second intermediate signal, wherein the first and second variable capacitances are connected in parallel, and wherein the first and second variable capacitances are differentiated by a configuration parameter so that, for the first control state, the first variable capacitance of the first electronic component is different from the second variable capacitance of the second electronic component for the second control state; and a digital/analog converter to convert a digital control signal into an analog control signal, an output of the digital/analog converter being linked to respective inputs of the non-inverting transmission link and of the inverter.

27. The electronic circuit element of claim 26 wherein a variation in capacitance of the electronic circuit element is at least three times less than a variation in capacitance of each of the first and second electronic components.

28. The electronic circuit element of claim 26 wherein the first electronic component comprises a first pair of varactors connected in series, the first pair of varactors are of one and the same electronic component having respective inputs linked together and forming the input of the first electronic component to receive the first intermediate signal, first respective outputs of the first pair of varactors are linked together to form the series connection and second respective outputs of the first pair of varactors from the respective outputs of the first electronic component.

29. The variable-capacitance device of claim 12, further comprising a digital/analog converter to convert a digital control signal into an analog control signal, an output of the digital/analog converter being linked to respective inputs of the non-inverting transmission link and of the inverter.

30. The oscillator of claim 18, further comprising a digital/analog converter to convert a digital control signal into an analog control signal, an output of the digital/analog converter being linked to respective inputs of the non-inverting transmission link and of the inverter.

31. The method of claim 21, further comprising:
converting a digital control signal into an analog control signal; and
supplying the converted digital control signal to respective inputs of the non-inverting transmission link and of the inverter.

* * * * *